US006248176B1

(12) United States Patent
Yudovsky et al.

(10) Patent No.: US 6,248,176 B1
(45) Date of Patent: *Jun. 19, 2001

(54) APPARATUS AND METHOD FOR DELIVERING A GAS

(75) Inventors: Joseph Yudovsky, Palo Alto; Kenneth Tsai, Redwood City; Steve Ghanayem, Sunnyvale; Semyon Sherstinsky, San Francisco, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/390,136

(22) Filed: Sep. 3, 1999

Related U.S. Application Data

(63) Continuation of application No. 08/893,769, filed on Jul. 11, 1997, now Pat. No. 5,985,033.

(51) Int. Cl.[7] ............................. C23C 16/00; C23C 14/00
(52) U.S. Cl. .................... 118/715; 118/728; 118/500; 204/298.07; 204/298.11; 204/298.15; 427/248.1
(58) Field of Search ...................... 118/715, 728, 118/729, 730, 500; 204/298.07, 298.11, 298.15; 427/248.1

(56) References Cited

U.S. PATENT DOCUMENTS

| 5,238,499 | 8/1993 | van de Ven et al. ................. 118/724 |
| 5,516,367 | 5/1996 | Lei et al. .............................. 118/725 |
| 5,556,476 | 9/1996 | Lei et al. .............................. 118/728 |
| 5,985,033 | * 11/1999 | Yudovsky et al. ................... 118/715 |

FOREIGN PATENT DOCUMENTS

0688888A2  12/1995  (EP)  .............................  C23C/16/44

* cited by examiner

Primary Examiner—Jeffrie R. Lund
(74) Attorney, Agent, or Firm—Thomason, Moser & Patterson LLP

(57) ABSTRACT

A gas delivery method and apparatus for directing a purge gas to the edge of a substrate at an angle to a linear divergence from the center of the substrate. The apparatus directs a purge gas from a supply source over a deflection surface, having one or more grooves angled relative to a linear divergence from the center of the substrate, to the edge of the substrate. Preferably, the gas is delivered to the edge of the substrate at an angle between about 10 and 90 degrees to a linear divergence from the center of the substrate.

20 Claims, 5 Drawing Sheets

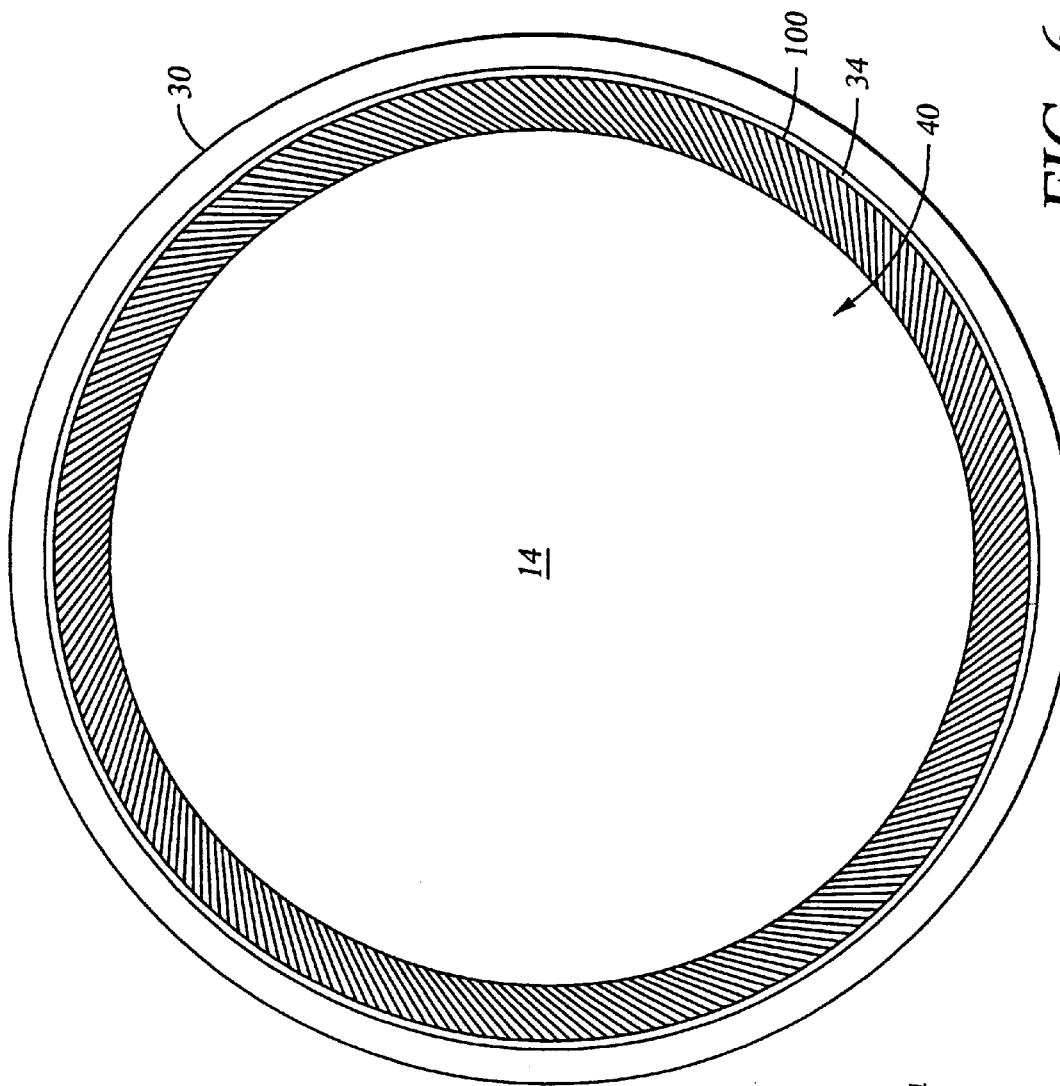
FIG. 6
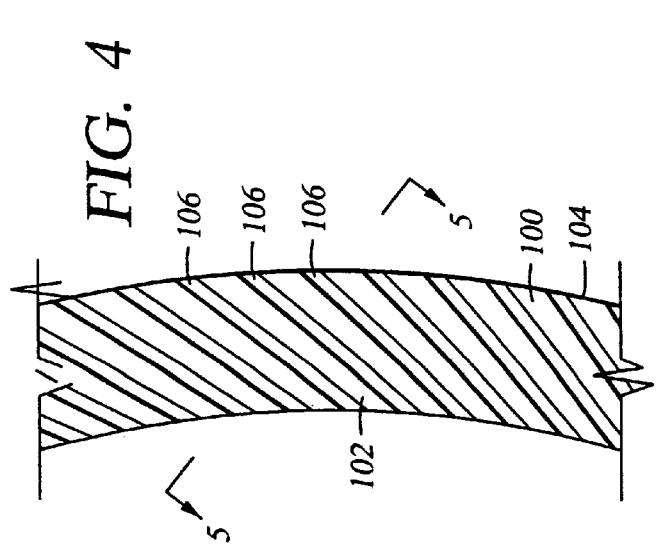
FIG. 4
FIG. 5

APPARATUS AND METHOD FOR DELIVERING A GAS

This is a continuation of application Ser. No. 08/893,769 filed on Jul. 11, 1997 now U.S. Pat. No. 5,985,033.

BACKGROUND OF THE INVENTION

1. Field of the Invention

The present invention relates to the field of semiconductor substrate processing equipment. More particularly, the present invention relates to an apparatus and method for directing a purge gas at an angle to the radial direction of a substrate to prevent deposition in the exclusionary zone near the edge, on the edge, and on the back side of the substrate without interfering with the deposition of the desired film on the substrate.

2. Background of the Related Art

In the fabrication of integrated circuits, equipment has been developed to automate substrate processing by performing several sequences of processing steps without removing the substrate from a vacuum environment, thereby reducing transfer times and contamination of substrates. Such a system has been disclosed for example by Maydan et al, U.S. Pat. No. 4,951,601, in which a plurality of processing chambers are connected to a transfer chamber. A robot in a central transfer chamber passes substrates through slit valves in the various connected processing chambers and retrieves them after processing in the chambers is complete.

The processing steps carried out in the vacuum chambers typically require the deposition or etching of multiple metal, dielectric and semiconductor film layers on the surface of a substrate. Examples of such processes include chemical vapor deposition (CVD), physical vapor deposition (PVD), and etching processes. Although the present invention pertains primarily to CVD processes, it may have application to other processes as well.

Vacuum chambers are employed to deposit thin films on semiconductor substrates.

Typically, a precursor gas is charged to a vacuum chamber through a gas manifold plate situated above the substrate, which substrate is heated to process temperatures, generally in the range of about 250 to about 650° C. The precursor gas reacts on the heated substrate surface to deposit a thin layer thereon.

To increase manufacturing efficiency and device capabilities, the size of devices formed on a substrate has decreased, and the number of devices formed on a substrate has increased in recent years. Also, it is increasingly important that the thin films be of uniform thickness across the substrate so that all of the devices on the substrate are uniform. Further still, it is increasingly important that the generation of particles in processing chambers be avoided to reduce contamination of substrates that will reduce the yield of good devices.

In a typical process chamber, a support member on which a substrate is mounted during processing is movable vertically in the chamber. The substrate is brought into the chamber from an external robot blade. A plurality of support fingers are also vertically movable by an elevator and extend through the support member to facilitate transfer of the substrate from the robot blade to the support member. In most CVD processes, the substrate and the support member on which it is supported are typically heated.

Such process chambers may be used to deposit metals, such as tungsten, from $WF_6$ precursor gas onto the substrate as well as other metals and dielectrics. $WF_6$ is a highly volatile gas, and problems have arisen because tungsten deposits not only on the top side of the substrate, but also on the edge surfaces and back side of the substrate. These edge and back side surfaces are typically rougher than the highly polished top surface and are not coated with an adhesive layer such as sputtered titanium nitride and, thus, the deposited materials tend to flake off the edge and bottom surfaces of the substrate, thereby contaminating the chamber. Also, material deposited on these surfaces may cause the substrate to adhere to the support member and may compromise the integrity of the devices formed near the edge of the substrate. Additionally, some processes use a barrier metal film that is, for example, formed of titanium and titanium nitride that covers the entire substrate surface wherein the titanium layer is partially exposed. Often in these processes, a layer of tungsten is deposited on the barrier layer. However, as tungsten is not adhesive to titanium, the tungsten deposited thereon tends to exfoliate therefrom, thereby creating particles.

Thus, shadow rings and purge gas have come into use. Shadow rings cover the periphery of the substrate during deposition to mask this area of the substrate, thereby preventing the deposition gases from reaching the edge and back side surfaces of the substrate. However, due to the volatility of $WF_6$, for example, shadow rings alone do not prevent edge and back side deposition on the substrate. The use of a purge gas directed behind or at the edge of the substrate behind the shadow ring has therefore been tried. The purge gas exerts a positive pressure that reduces the likelihood that processing gas will reach these edge and back side surfaces. In systems using a purge gas, the support member has a plurality of spaced purge gas orifices extending therethrough that deliver the purge gas to an annular gas groove in the upper surface of the support member. The annular gas groove surrounds the substrate and delivers the gas to the peripheral edge of the substrate. Typically, this gas is delivered to the substrate from below the edge so that it flows around the edge of the substrate and effectively flows over the upper surface of the substrate in a direction perpendicular to the edge of the substrate. One example of a shadow ring and gas passage is shown in U.S. Pat. No. 5,516,367 which issued on May 14, 1996, which is hereby incorporated by reference.

As the desire for greater throughput and efficiency has increased, the standards governing the thickness and uniformity of the deposited film at the substrate edge have continually become more stringent. Ideally, the deposited film has a uniform thickness across the full area of the substrate with the edges dropping off rapidly so that the zone of exclusion has little or no deposition thereon. Further, there is ideally no deposition on the beveled edges of the substrate. Industry practice has moved toward this ideal goal so that the current industry standards demand no film deposition on the beveled edge of the substrate and a film thickness at a point 3 mm from the edge of the substrate that is 90 percent or more of the film thickness at the center of the substrate with a thickness uniformity of ±5 percent, excluding the area within 5 mm from the substrate edge.

One important element in meeting the requirements involves optimization of the purge gas delivery and its flow rate. If the flow of purge gas is too great, the purge gas may prevent or interfere with the deposition of the process gas on the substrate where deposition is desired. As the flow rate rises, the purge gas flows further inward toward the center of the substrate causing greater interference with the process gas flow and its even distribution. Therefore, the interference may cause film uniformity problems near the edge of the substrate as well as further toward the center of the substrate. Accordingly, a high flow rate of purge gas may prevent the process from meeting the uniformity requirements of industry standards. However, a relatively high flow rate may be needed to increase the positive pressure produced by the purge gas in order to meet the industry requirements for edge exclusion and for prevention of deposition on the edge and back side surfaces of the substrate.

Therefore, there is a need to provide a system which prevents back side deposition and meets the edge exclusion demands of the industry while not affecting deposition uniformity across the surface of the substrate.

SUMMARY OF THE INVENTION

The present invention provides an apparatus and method for delivering a gas to the edge of a substrate. More specifically, the present invention is a gas delivery apparatus that directs a purge gas to the edge of a substrate at an angle relative to the radial direction of the substrate. One aspect of the invention uses a deflection member having a peripheral edge and a deflection surface to deliver a purge gas from the peripheral edge of the deflection member to the edge of a substrate at an angle to the radial direction of the substrate. A gas flow restricting member adapted and positioned to direct the flow of the gas from the peripheral edge of the deflection member over the deflection surface of the deflection member to the edge of the substrate ensures that flow of the gas maintains contact with the deflection surface. To provide the necessary angled flow, the deflection surface is adapted to direct the flow of the gas at an angle to the radial direction of the substrate and the deflection member to form a wall of gas around the edge of the substrate that resembles a tornadic wall. A gas supply member of the apparatus supplies the gas to the peripheral edge of the deflection member.

Another aspect of the invention provides an apparatus for processing a substrate having a support member which defines a purge gas passage which directs a purge gas to the peripheral edge of a deflection member. The deflection member of the apparatus is coupled to the upper surface of the support member and has a deflection surface. The deflection member defines an interior region that has a shape that is substantially coextensive with the shape of the substrate. A gas flow restricting member is adapted and positioned to direct the flow from the peripheral edge of the deflection member over the deflection surface of the deflection member to the edge of the substrate. Creating the angled flow, the deflection member is adapted to direct the flow of the gas at an angle to the radial direction of the substrate to create a gas wall about the edge of the substrate. Grooves in the deflection surface may be used to effect the angled flow. The deflection member may be integral with the support member or a removable ring attached thereto or otherwise placed in the process chamber.

A further aspect of the invention is a method of delivering a gas to a substrate supported on an upper surface of a support member in a process chamber, the substrate having an edge, comprising providing a flow of the gas at an angle to the radial direction of the substrate.

Preferably, the apparatuses and methods previously described deliver the flow of gas at an angle of between about 10 and 90 degrees relative to the radial direction of the substrate. More preferably, the angle is about 65 degrees relative to the radial direction of the substrate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments there of which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 is a partial, top elevational view of the deflection member showing the angled grooves.

FIG. 5 is a cross sectional view taken along lines 4—4 in FIG. 3 showing the grooves of the deflection member.

FIG. 6 is a top elevational view of the support member showing the deflection member thereon.

DETAILED DESCRIPTION OF THE PREFERRED EMBODIMENT

Figure 1:
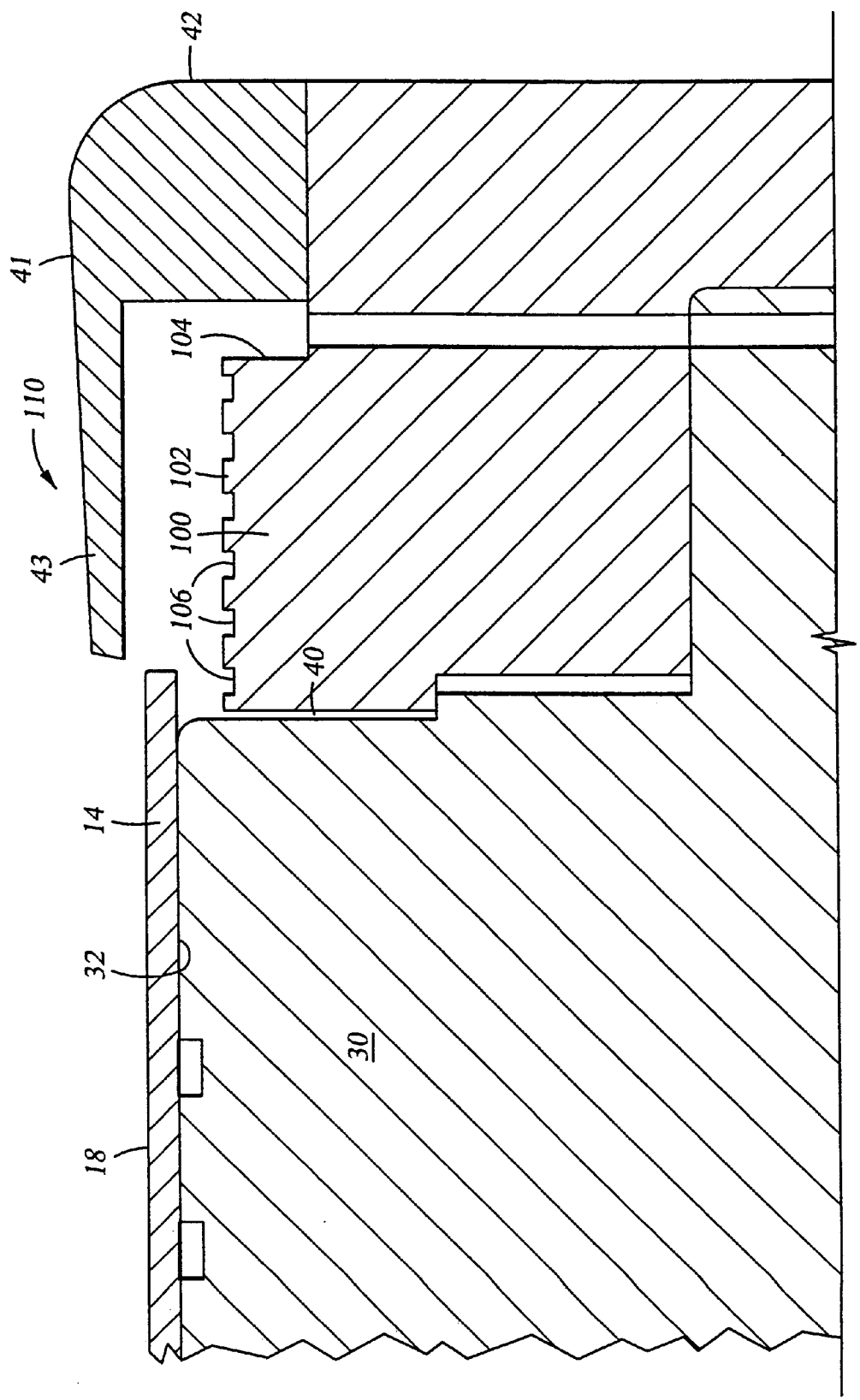
FIG. 1 is a cross sectional side elevational view of the gas delivery apparatus.

The present invention generally provides a device for delivering a flow of purge gas at an angle to the radial direction of a substrate 14. More particularly, the invention provides a gas delivery apparatus 20 that directs the flow of a purge gas within a process chamber 12 from a gas supply to the edge 18 of a substrate 14 at an angle to the radial direction of the substrate 14 so that the purge gas will not flow over the center of the substrate 14 and disrupt the deposition of the film formed by the process gas on the substrate 14. This gas delivery apparatus 20 is particularly useful in CVD processing chambers and the following description refers primarily to these CVD processes to facilitate description and understanding. However, it is to be understood that the gas delivery apparatus 20 may have application to other processes, process chambers, and apparatuses, such as PVD and etching apparatuses, and is, therefore, not limited to the precise form described.

Typically, substrates 14 are thin, circular members. Accordingly, they have a center, a periphery wherein each point along the periphery is substantially equidistant from the center, a radial direction characterized by a linear divergence from the center, and tangents, or a tangential direction characterized by a line, or lines, meeting the periphery at a single point. The tangential direction and radial direction are perpendicular to one another. Although substrates are typically circular, the present invention is equally applicable to non-circular substrates. Therefore, as used herein, the term radial direction refers to a direction characterized by a linear divergence from the center of the substrate 14.

In general, substrates 14 are processed in a process chamber 12 on a support member 30 positioned therein. In the processing of substrates 14, a shadow ring 70 is often used to cover the edge of the substrate 14 and, thereby, provide an exclusionary zone on which no deposition is allowed. By covering the outer periphery of the substrate 14, the shadow ring 70 helps prevent unwanted deposition of material on the exclusionary zone of the upper surface 16 of the substrate 14 which includes the beveled edges of the substrate 14. Although the shadow ring 70 is effective at preventing such deposition, a more effective system also incorporates the use of a purge gas directed about the periphery of the substrate 14 which flows about the peripheral edge 18 of the substrate 14 and over its upper surface 16 proximal the periphery. A purge gas line 48 is present in the support member 30 so that a purge gas, such as argon, can be passed into a plurality of purge gas openings 49 in the support member 30 that direct the purge gas to a gas orifice 34, which is preferably in the form of a continuous annular gas groove formed in the upper surface 32 of the support member 30. In this way, the flow of gas may be delivered about the full periphery of the substrate 14, thereby inhibiting the process gas from coming in contact with the substrate edge surface, the exclusionary zone, and from flowing to the back side of the substrate 14 and depositing material thereon.

Therefore, one factor in optimizing the construction of the process chamber 12 to allow it to meet the required deposition standards is the flow of the purge gas delivered to the edge 18 of the substrate 14. The flow of purge gas must be relatively gentle and steady to avoid disrupting the process gas and causing its uneven distribution across the substrate surface. However, relatively higher flow rates of purge gas that increase the positive pressure created by the gas may be necessary to improve the edge protective effect of the gas. Because current designs deliver the flow of gas either directly to the edge 18 of the substrate 14 or radially to the edge 18 of the substrate 14, the gas flows over the edge of the substrate 14 and radially to toward the center of the substrate 14. Consequently, as gas flow rates increase, the purge gas flows further toward the center of the substrate 14 in greater volumes. This flow of gas over the area of the substrate 14 where deposition is desired disturbs the flow of the process gas causing unequal deposition on the substrate 14.

To overcome this problem of the flow of the purge gas flowing over the substrate 14 and disrupting the purge gas and the deposition of the film on the substrate 14, the present invention directs the flow of the gas so that it flows at an angle to the radial direction of the substrate 14. In this way the gas creates a protective wall of gas about the edge of the substrate 14. Of course, the device may take many forms.

The preferred embodiment, shown in FIGS. 1 through 6, uses a deflection member 100 mounted to or integrally formed with the support member 30. The deflection member 100 comprises an annular ring disposed about the upper surface 32 of the support member 30. Because the preferred shape of the deflection member 100 is annular, it, like the substrate 14, has a radial dimension along its surface. The inner diameter of the deflection member 100 defines an interior region 40 that has a shape and size that is substantially coextensive with the shape and size of the substrate 14, preferably slightly less in diameter than the outer diameter of the substrate. The deflection member 100 is positioned about the support member 100 so that a substrate 14 placed and properly aligned on the upper surface 32 of the support member 30 is positioned within the inner diameter of the deflection member 100. Accordingly, when placed upon the support member 30, the edge of substrate 14 is positioned adjacent or slightly over the interior region 40.

As previously mentioned, a plurality of purge gas openings 49 in the support member 30 that direct the purge gas to a gas orifice 34, which is preferably in the form of a continuous annular gas groove formed in the upper surface 32 of the support member 30, are formed in the support member 30. The annular gas groove surrounds the outer diameter of the deflection member 100 so that the outer periphery of the deflection member 100 is about equal to the inner diameter of the annular gas groove. In this way, the flow of gas may be delivered about the full periphery of the deflection member 100.

Figure 2:
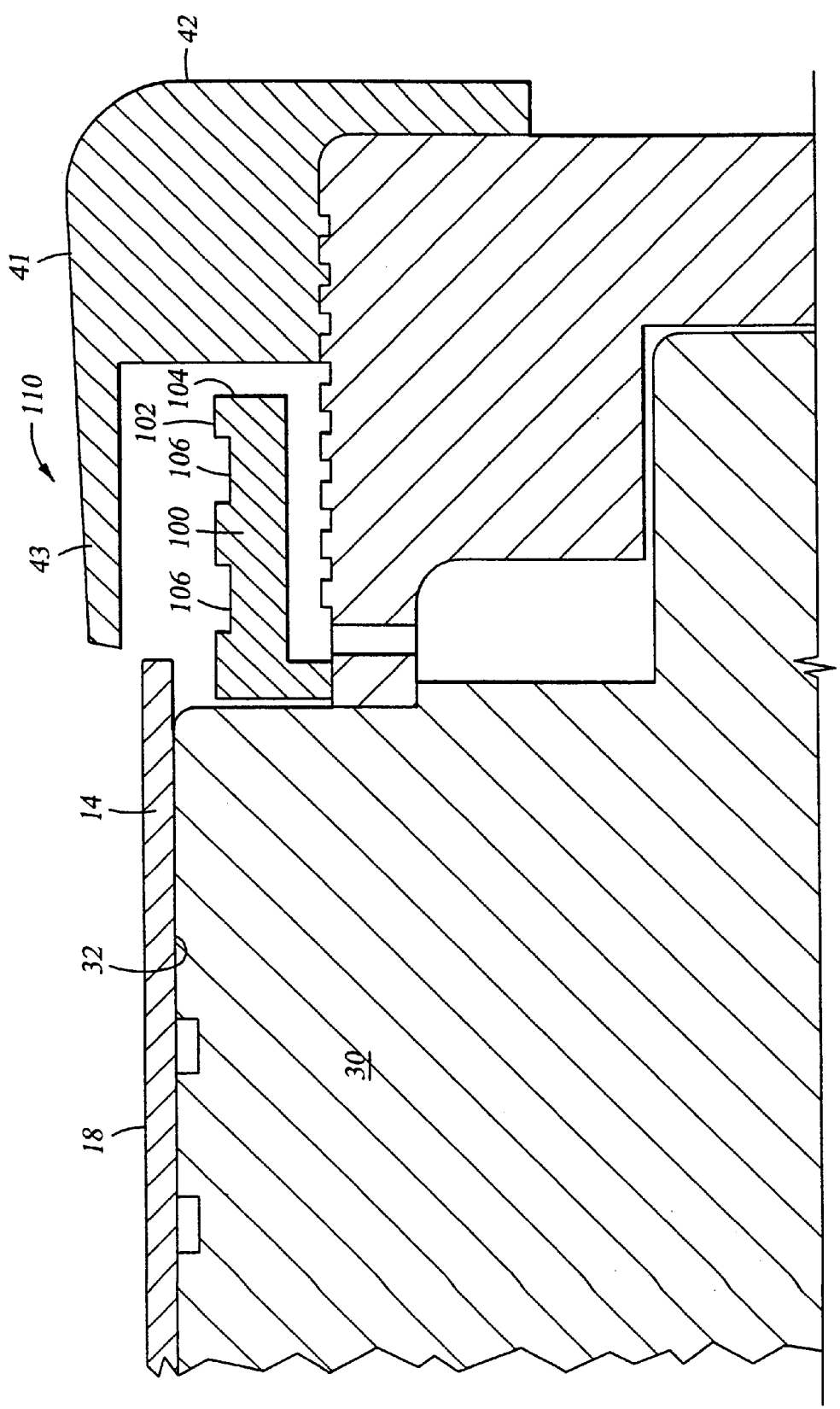
FIG. 2 is a cross sectional side elevational view of an alternate embodiment of the gas delivery apparatus.

A gas flow restricting member 110 is positioned and adapted to direct the flow of the gas from a peripheral edge 104 of the deflection member, over its deflection surface 102, to the edge 18 of the substrate 14. FIGS. 1 and 2 show the preferred embodiment for the gas flow restricting member 110. In this preferred embodiment, the gas flow restricting member 110 comprises an annular ring attachment fixedly attached, preferably by welding, to the support member 30 so that it is an integral part of the support member 30. The ring attachment 41 has a base portion 42 that rests upon the upper surface 32 of the support member 30 and extends upward therefrom. The base portion 42 has an inner diameter that is greater than the diameter of the gas groove and is positioned so that the base portion 42 surrounds the gas groove. Thus, the base portion 42 forms a wall around the gas groove through which the purge gas cannot pass. An overhanging portion 43 of the ring attachment 41 extends from the top of the base portion inward toward the center of the support member 30 in spaced relation to the upper surface and the deflection member 100. The base portion 42 is integral with the overhanging portion 43 and supports the overhanging portion 43 over the deflection member 100. Preferably, the overhanging portion 43 is maintained above the upper surface 32 so that the lower surface of the overhanging portion 43 is vertically offset slightly higher than the upper surface 16 of a substrate 14 placed on the support member 30 so that the purge gas is directed at the edge and upper surface 16 of the substrate 14. Thus, the ring attachment 41, which is adapted to prevent gas from flowing therethrough, directs the purge gas from the gas groove over the deflection surface 102 of the deflection member 100, and to the edge of the substrate 14.

Figure 3:
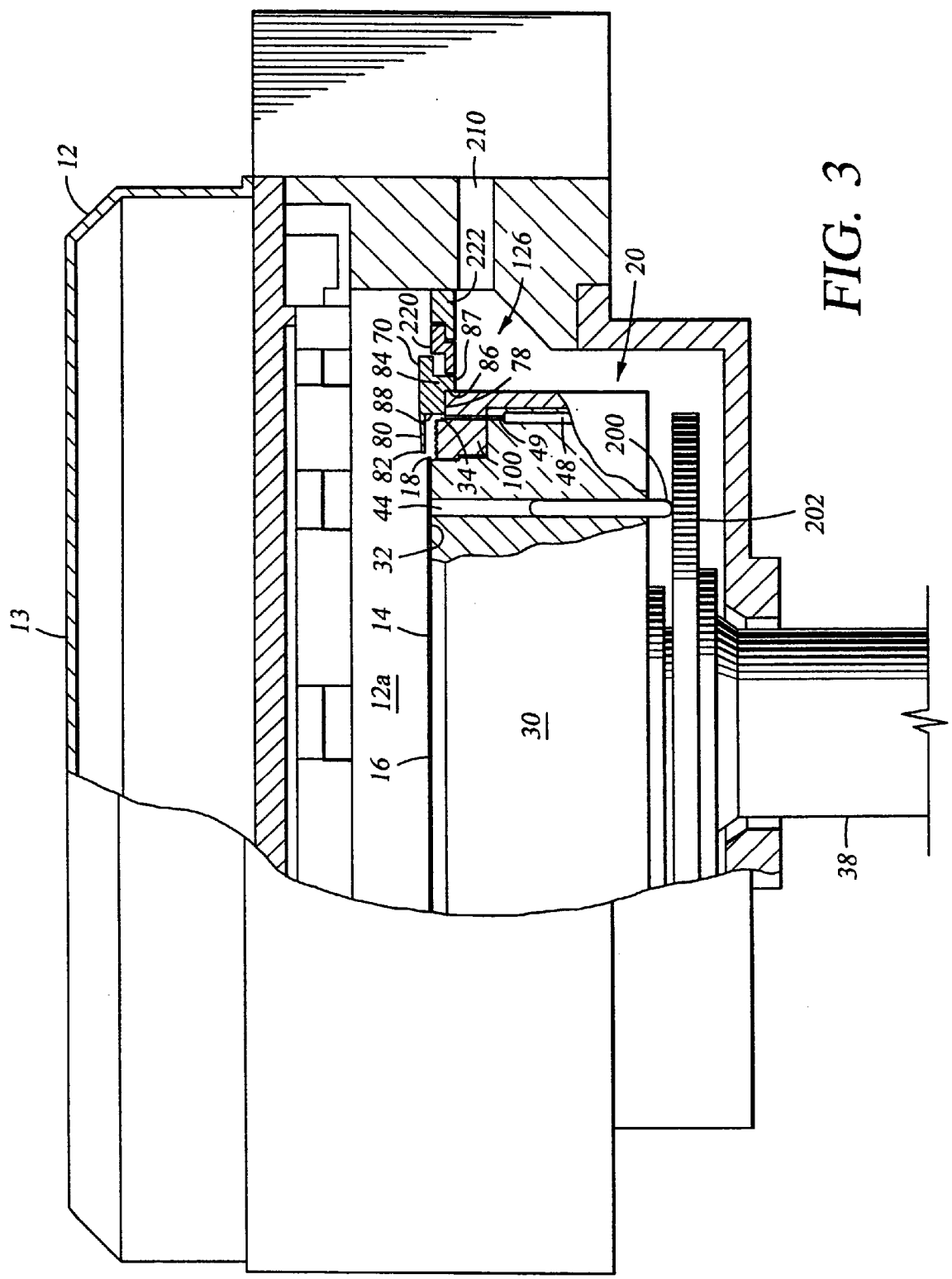
FIG. 3 is a partial cross sectional, side elevational view of the process chamber incorporating the present invention.

FIG. 3 shows an alternate embodiment of the gas flow restricting member 110 wherein the shadow ring 70 acts as the gas flow restricting member 110. A spacer support 78 of the shadow ring 70 rests on the upper surface 32 of the support member 30 holding the shield portion 80 a predetermined, spaced distance above the support member 30 and the substrate 14. The inner diameter of the spacer support 78 is greater than the outer diameter of the gas orifice 34 so that the spacer support 78 surrounds the gas orifice 34. Because the spacer support 78 is a continuous ring that rests on the upper surface 32, the spacer support 78 forms an outer wall that prevents gas from flowing outwardly from the gas orifice 34. Further, the shield portion 80 extends from the spacer support 78 inwardly toward the substrate 14 and to a position that is, preferably, slightly overhanging the substrate 14. Thereby, the shield portion 80 overhangs the deflection surface 102 of the deflection member 100 and forms an upper wall or ceiling through which the gas cannot pass. Preferably, the space between the shield portion 80 and the upper surface 32 of the support member 30 is relatively small so that the gas flowing therebetween contacts the deflection surface 102 of the deflection member 100. Therefore, the upper surface 32 of the support member 30, the shield portion 80 of the shadow ring 70, and the spacer support 78 define a passageway that directs the flow of the gas from the annular gas groove over the deflection surface 102 to the edge 18 of the substrate 14. The deflection member 100 is adapted to direct the flow of the gas to the edge 18 of the substrate 14 at an angle relative to the radial direction of the substrate 14.

In the preferred embodiment, the deflection member 100 defines one or more grooves 106 in the deflection surface 102 that extend from the peripheral edge 104 of the deflection member 100 to the inner diameter of the deflection member 100 proximal the edge 18 of the substrate 14. Preferably, the deflection member 100 has a plurality of grooves 106, between about 100 and about 200 in number, closely spaced from one another about the full circumference of the deflection member 100. Preferably, the grooves 106 are equally spaced from one another to deliver gas uniformly to the edge 18 of the substrate 14. The grooves 106 are oriented at an angle to the radial direction of the substrate 14 so that the gas flows around the edge 18 of the substrate 14 forming a protective gas wall around the edge 18. In this way, as the flow of the gas flows from the gas orifice 34 over the deflection surface 102 of the deflection member 100, the grooves 106 direct the flow from a simple radial flow to an angled flow that, when viewed as a combination of the flow from all of the grooves 106 spaced about the periphery of the substrate 14, creates a wall of purge gas around the periphery of the substrate 14. At least a portion of the gas enters the angled grooves 106 and flows through the grooves 106 to the edge of the substrate 14. Thus, rather than flowing radially toward the center of the substrate 14, the flow of the gas flows only over the area proximal the edge 18 of the substrate 14 forming a protective wall of gas that preferably flows no more than about 0.42 inches over the substrate 14. The gas wall is annular in shape due to the angled flow of the gas. The angle of the grooves 106 to the radial direction of the substrate 14 and the resulting angle of the flow relative to the radial direction of the substrate 14 may vary depending upon the exact application and its variables, such as the gas flow rate. However, the preferred angle of the grooves 106 and the flow relative to the radial direction of the substrate 14 is between about 10 degrees and about 90 degrees (i.e., tangential flow). More preferably, the angle of flow relative to the radial direction of the substrate 14 is about 65 degrees.

A variety of alternate embodiments for the present invention are possible. For example, the deflection member 100 may be integral with the support member 30, as shown in FIG. 3, or a separate piece attached to the support member 30 as shown in FIG. 2. Further, the deflection member 100 may be oriented in the same horizontal plane as the upper surface 32 of the support member 30, as shown in FIG. 3, or positioned slightly below the upper surface 32 to provide a greater space between the grooves 106 and the restricting member 110 as shown in the retrofit attachable ring design of FIGS. 1 and 2. The grooves 106 may be linear, parabolic, or otherwise shaped as long as they produce the angled flow at the edge 18 of the substrate 14. For instance, a parabolic shaped groove may provide a more laminar flow because the change in direction of flow is less abrupt. Additionally, the gas flow restricting member 110 may have a variety of embodiments such as one wherein the gas flow restricting member 110 is an integral portion of the support member 30 that extends upwardly and inwardly from the perimeter of the support member 30 to define a passageway that maintains the gas flow proximal the deflection surface 102 of the deflection member 100. Many alternate embodiments for the deflection member 100 are possible as well, a few of which are described below.

As previously discussed, the gas flow restricting member 110 forms a ceiling (i.e. the shield portion 78 of the shadow ring 70 in the preferred embodiment) for restricting the flow of the gas. One alternate embodiment, therefore, is to provide the deflection surface 102 on this ceiling rather than the "floor" as shown in the figures.

Other alternate embodiments may replace the grooves 106 of the preferred embodiment with other devices capable of affecting the flow of the gas. For example, the grooves 106 may be replaced with angled fins, or thin walls, that extend between the upper surface 32 of the support member 30 and the shield portion 78 of the shadow ring 70. The fins, thus, form passageways therebetween that direct the flow of the gas at an angle to the radial direction of the substrate 14.

Another alternate embodiment involves simply redirecting the direction to which the purge gas openings 49 emit the flow of the gas. In present designs, the purge gas openings 49 emit the flow of gas vertically upward into the annular gas groove formed in the upper surface 32 of the support member 30. In the alternate embodiment, these purge gas openings 49 are redesigned along with the support member 30 so that the purge gas openings 49 emit the flow of the gas horizontally toward the edge 18 of the substrate 14 at an angle to the radial direction of the substrate 14. Thus, in this alternate design, the support member 30 must have an outer raised portion that defines an interior region into which the substrate 14 is placed during processing. The height of the raised portion is sufficient that the purge gas openings 49 may open to their inner surfaces. For example, the raised portions may comprise a spacer support 78 that is integral with the support member 30. The purge gas openings 49 would, thus, extend through the support member 30 into the spacer support 78 and exit the spacer support horizontally at the inwardly facing surface of the spacer support 78 directing the flow of the gas toward the substrate 14. The purge gas openings 49 however, would be directed to provide a flow of the gas at an angle to the radial direction of the substrate 14. Because a typical support member 30 has between about 300 and 500 purge gas orifices spaced about its perimeter, the gas distribution would be substantially even about the full periphery of the substrate 14. The exit orifices of the purge gas openings 49 may comprise nozzles to accelerate the flow of the gas therefrom. Other alternate embodiments and mechanisms are possible for delivering the flow of the purge gas at an angle to the radial direction of the substrate 14.

FIG. 3 shows a typical process chamber 12 defined by an outer body 13. The chamber 12 may be part of a vacuum processing system having a plurality of process chambers 12 connected to a central transfer chamber. The process chamber 12 houses the support member 30 that may take the form of a pedestal or susceptor mounted on a generally vertically oriented shaft 38. The support member 30 serves to support a substrate 14 on its flat upper surface 32. The support member 14 also includes four finger apertures 44. Typically, the support member comprises a block of metal, e.g., aluminum, that has a single coil resistance heater embedded therein. However, the support member may be formed of other materials such as ceramic. In order to provide uniform heating of the support member 30 and to uniformly heat the substrate 14 mounted thereon, the coil must be in contact with the bulk of the support member 30 on all sides. Note that, for the present invention, the heater is not required. As shown in FIGS. 1 and 2, the upper surface 32 may include a plurality of equally spaced concentric groove which are provided to reduce the surface area of contact between the upper surface 32 and the shadow ring 70 and the substrate 14. Reducing the surface area of contact reduces the likelihood of sticking between the parts which must be free to move due to their differing coefficients of thermal expansion and reduces the heat conduction between the parts.

FIG. 3 also illustrates a substrate lifting finger 200 received in the finger aperture passing through the body of the support member 30. Typically, the process chamber 12 would include four such lifting fingers 200. These lifting fingers 200 operate to lift the substrate 14 clear of the upper surface 32 of the support member 30 after processing. This removal of the substrate 14 is achieved by means of a conventional process chamber robot arm (not shown) which enters the process chamber 12 through the slit valve opening 210. The same robot arm is also used to insert the substrates 14 into the process chamber 12. The lifting fingers 200 are movable vertically under action of a secondary motion actuator 202 of which only the upper portion is shown in FIG. 3.

A motion actuator interconnected to the support member 30 is adapted to move the support member 30 vertically within the process chamber 12 alternately between a first, lowered position and a second, raised position where the process step is performed. In operation, the substrate 14 is placed onto the upper surface 32 of the support member 30 as follows. The robot arm inserts the substrate 14 into the process chamber 12 through the slit valve opening 210 supporting the substrate vertically above the support member 30. The secondary motion actuator (not shown) raises the lifting fingers 200, which extend through finger apertures in the support member 30, into contact with the substrate 14 and lifts the substrate 14 from the robot arm supporting the substrate 14 intermediate the first and second positions of the support member 30. The robot arm is retracted from the process chamber 12. Next, the motion actuator lifts the support member 30 from the first position, past the top of the lifting fingers 200, to the second position. This motion of the support member 30 lifts the substrate 14 from the lifting fingers 200. Performing these steps in reverse order operates to complete a transfer of the substrate 14 from the support member 30 to the robot arm and from the process chamber 12.

The shadow ring 70 housed within the process chamber 12 operates to provide an exclusionary zone where no deposition occurs at the edge of the substrate 14. In one embodiment, the shadow ring 70 also operates to force a misaligned substrate 14 into alignment as the support member 30 moves from the first position to the second position. When the support member 30 is in the lowered position, the shadow ring 70 is supported around its perimeter by an outer support ring 220 that is, in turn, supported by a conventional pumping plate 222 attached to the vacuum chamber 30. Together, the two rings, 70 and 220, divide the process chamber 12 into upper and lower sections, 12a and 12b respectively.

During processing, the support member 30 moves upward into a raised position lifting the shadow ring 70. The shadow ring 70 has a lower portion 84 that rests on the upper surface 32 of the support member 30 and supports the upper shield portion 80 of the shadow ring 70 above-the upper surface of the substrate 14. The upper shield portion 80 of the shadow ring 70 defines a circular upper aperture 82 therethrough. The diameter of the upper aperture 82 may be slightly less than the outer diameter of the substrate 14 to form an exclusionary zone on the substrate 14. However, new processes may require no overhang of the shadow ring 70 over the substrate 14.

The shadow ring 70 is maintained above the substrate 14 using at least one spacer support 78 that is coupled to the bottom surface of the shadow ring 70 although the spacer may alternatively be coupled to the support member 30 and, as previously described, is the lower portion 84 of the shadow ring 70. Preferably, the spacer support 78 is an annular raised portion extending from the lower surface of the shadow ring 70 and has a diameter that is smaller than the outer diameter of the of the support member 30. It is thus the spacer support 78 that contacts the support member 30 when the shadow ring 70 is supported by the support member 30. The spacer support 78 is sufficiently thick and the overall design of the shadow ring 70 is such that they maintain the shadow ring 70 a predetermined distance, preferably about 3 to 5 mils, above the upper surface 16 of the substrate 14 when the support member 30 is in the second position. Maintaining the shadow ring 70 above the upper surface 16 of the substrate 14 is necessary to allow the flow of purge gas between the shadow ring 70 and the substrate 14.

Often, when introduced into the process chamber 12, the substrate 14 is misaligned relative to the support member 30. To correct the misalignment and help ensure proper deposition, the process chamber 12 typically includes an alignment apparatus to align the substrate 14 on the support member 30 as the support member 30 moves from the first position to the second position. One type of alignment apparatus comprises a lower portion 84 of the shadow ring 70 as shown in FIG. 3. Another type of alignment apparatus uses a set of guide pins 50 attached to the upper surface 32 of the support member 30. Although other alignment apparatuses are known and possible, the shadow ring type and guide pin type of alignment apparatuses respectively are discussed below.

Defining the first, shadow ring type of alignment apparatus, a lower portion 84 of the shadow ring 70 extends downwardly from the upper shield portion 80. The lower portion 84 has an annular cross section throughout its length and defines a frustoconical inner cavity 86 therein that is concentric with the upper aperture 52. The diameter of the inner cavity 86 decreases from the lower mouth portion 87 to the upper end 88 of the inner cavity 86 to form a funnel-like structure for aligning the substrate 14 on the support member 30. Accordingly, the surface of the inner cavity 86 is relatively smooth to facilitate the sliding receipt and abutment of the substrate 14 in the inner cavity 86. To allow receipt of the substrate 14 within inner cavity 86 and to properly align the substrate 14 with the shadow ring 70, the diameter of the upper end 46 of the inner cavity 86 is slightly greater than and, preferably, approximately equal to the outer diameter of the substrate 14. Preferably, the diameter of the upper end 46 of the inner cavity 86 is slightly more than about 3 mm greater than the outer diameter of the substrate 14 to ensure that the misalignment of the substrate 14 is, at most, only slightly more than about 1.5 mm.

Once positioned in the process chamber 12, a substrate 14 rests on the upper supporting surface 32 of the support member 30. This placement is made with the support member 30 in its lowered position. Before processing may begin, the substrate 14 must first be raised by the support member 30 to the second, raised position. It is during the movement from the lowered position to the raised position that any misalignment of the substrate 14 is corrected and the substrate 14 is aligned. As the support member 30 moves upward from the lowered position, a misaligned substrate 14 contacts the inner cavity 86 of the shadow ring 70 at a position intermediate the upper end 88 and the lower mouth portion 87. The point of contact is dependent upon the magnitude of the misalignment. Preferably, there is no misalignment. As the support member 30 continues to move upward, the angled side of the frustoconically-shaped inner cavity 86 exerts a lateral force on the edge 18 of the substrate 14 forcing the substrate 14 into alignment. Consequently, when the support member 30 reaches its raised position so that the substrate 14 is at the upper end 88 of the inner cavity 86 of the shadow ring 70, the substrate 14 is no more than 1 mm out of alignment due to the relative diameters of the substrate 14 and the shadow ring components. When in this raised position, the shadow ring 70 rests on the support member 30 and leaves a small gap between the shadow ring 70 and the substrate 14. With the support member 30 in the raised position, the outer portion of the substrate 14 is covered by the upper shield portion 80 of the shadow ring 70. In this way, the shadow ring 70 corrects any misalignment of the substrate 14 on the support member 30.

Figure 7:
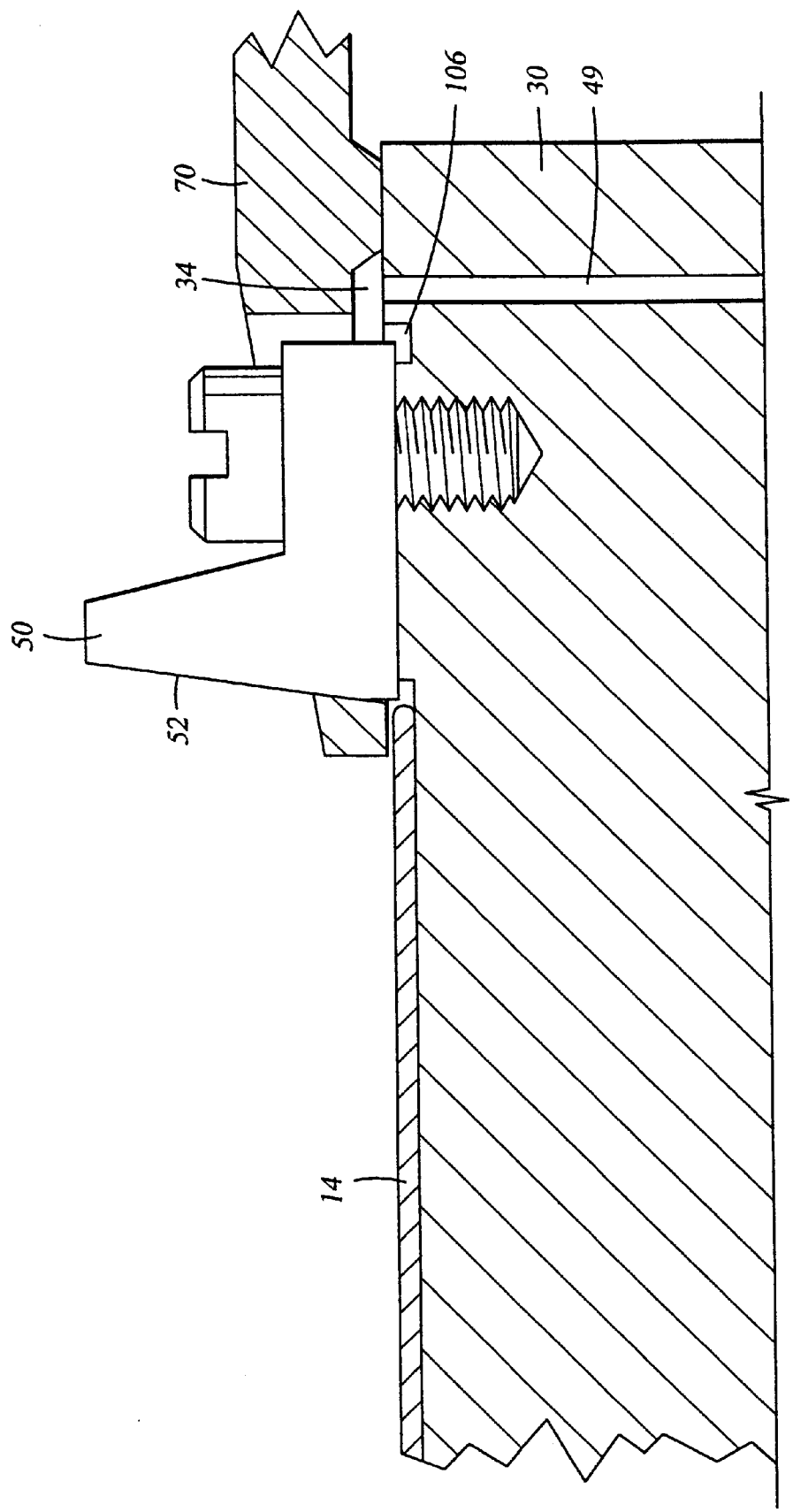
FIG. 7 is a partial cross sectional view of the gas delivery apparatus showing a guide pin type of alignment apparatus.

As mentioned, an alternate embodiment for correcting misalignment of the substrate 14 on the support member 30 uses a set of guide pins 50 attached to the upper surface 32 of the support member 30. The guide pins 50, shown in FIG. 7, are spaced about the upper surface 32 and are preferably equidistant from one another. The guide pins 50 are spaced in a circular pattern such that their inner surfaces 52 are sufficiently spaced that the lower ends of the inner surfaces 52 create a circular space therebetween that has a diameter that is substantially equal to the outer diameter of the substrate 14. Further the inner surfaces 52 define a volume therebetween that is sufficiently large to receive the substrate 14 therein and is substantially coextensive with the shape and size of the substrate 14. The inner surfaces 52 are angled outwardly from one another such that the top ends of the inner surfaces 52 are further from one another than their bottom ends. Therefore, the diameter of the circle formed by the inner surfaces 52 increases from a smallest diameter at the bottom of the inner surfaces 52 proximal the upper surface 32 of the support member 30 to a largest diameter at the top of the inner surfaces 52 distal the upper surface 32 of the support member 30. In this way, the inner surfaces 52 of the guide pins 50 form a funnel for receiving and aligning the substrate 14 on the support member 30. Preferably, the alignment apparatus 20 includes at least six guide pins 50.

As the support member 30 moves from the first position past the upper ends of the lifting fingers 200 to receive the substrate 14 thereon, any misalignment of the substrate relative to the support member 30 is corrected by the guide pins 50. If the substrate 14 is misaligned, the substrate will contact one or more of the guide pins 50, particularly their inner surfaces 52, intermediate the top and bottom ends of the guide pins 50. The height of the guide pins 50 and the angle of their inner surface 52 are sufficient that the largest diameter formed by the guide pins 50, at their upper end, is large enough to account for a substantial misalignment of the substrate 14 which will allow the guide pins 50 to capture and align all of the substrates 14 inserted into the process chamber 12. Typically, even the greatest misalignment of the substrate 14 is relatively small. FIG. 4 shows a substrate 14 aligned on the support member 30. After the guide pins 50 contact the substrate 14 and as the support member 30 continues to rise to the second position, the slanted inner surfaces 52 apply a lateral force on the peripheral edge 18 of the substrate 14 and force the substrate 14 into alignment. The inner surfaces 52 are relatively smooth so that the substrate 14 may slide along the inner surfaces 52 and any frictional forces therebetween are minimized, thereby reducing potential particle generation caused by the contact therebetween and minimizing any lifting force applied to the substrate 14 by the guide pin 50. Consequently, once the support member 30 has been raised sufficiently to receive the substrate on its upper surface 32, the guide pins 50 will have forced the substrate 14 to a lateral position within the smallest diameter of the inner surfaces 52 and into alignment with the support member 30. The proper alignment corresponds with the circular diameter formed at the lower ends of the guide pins 50.

Other embodiments for alignment apparatuses are possible. However, regardless of the specific construction of the alignment apparatus, the important feature is that the substrate 14 be properly aligned relative to the support member 30 so that the film deposited on the substrate 14 conforms to the strict industry requirements.

Once the substrate 14 is introduced into the process chamber 12 on the support member 30 and the support member 30 is raised to the second position so that the substrate 14 is aligned, the substrate 14 is ready for processing. The shadow ring 70 covers the exclusionary zone of the substrate 14. The purge gas flows through the purge gas openings 49 to the gas orifice 34 at the peripheral edge 104 of the deflection member 100. The gas flow restricting member 110 directs the gas over the deflection surface 102 of the deflection member 100 causing the purge gas to flow at an angle to the radial direction of the substrate 14. Thus, when the purge gas reaches the edge 18 of the substrate 14, the gas flows only over the peripheral portion of the substrate 14 forming a gas wall.

While the foregoing is directed to the preferred embodiment of the present invention, other and further embodiments of the invention may be devised without departing from the basic scope thereof, and the scope thereof is determined by the claims which follow.

What is claimed is:

1. An apparatus for directing the flow of gas to an edge of a substrate, comprising:
   a substrate support member;
   a gas supply member;
   a gas deflection member having a dimension of a substrate, a peripheral edge, and a deflection surface;
   a gas directing member having a ring adapted and positioned to direct the flow of the gas from the peripheral edge of the gas deflection member over the deflection surface of the gas deflection member; and
   one or more grooves formed in the deflection surface adapted to direct the flow of the gas at an angle to a linear divergence from the center of the gas deflection member.

2. The apparatus of claim 1, wherein the gas deflection member is disposed on the substrate support member.

3. The apparatus of claim 2, wherein the gas deflection member is integral with the substrate support member.

4. The apparatus of claim 1, wherein the gas deflection member is oriented in the same horizontal plane as the upper surface of the substrate support member or positioned slightly below the upper surface.

5. The apparatus of claim 1, wherein the one or more grooves are linearly or parabolicly shaped.

6. The apparatus of claim 1, wherein the one or more grooves extend from the peripheral edge of the gas deflection member at an angle between about 10 and 90 degrees to a linear divergence from the center of the gas deflection member.

7. The apparatus of claim 1, wherein the gas directing member comprises:
   a ring having a lower and upper portion adapted and positioned to direct the flow of the gas from the peripheral edge of the gas deflection member over the deflection surface of the gas deflection member;
   the lower portion integral with the substrate support member and extending upwardly and inwardly from the perimeter of the substrate support member to define a passage that maintains the gas flow proximal the deflection surface of the gas deflection member; and the upper portion extending from the lower portion to a position proximal the edge of the substrate.

8. The apparatus of claim 1, wherein the gas directing member further comprises a deflection surface disposed thereon having one or more grooves adapted to direct the flow of the gas at an angle to a linear divergence from the center of the gas deflection member.

9. The apparatus of claim 1, wherein the gas supply member comprises:

a gas passage that connects a gas supply to the peripheral edge of the gas deflection member;

a continuous annular gas groove that surrounds the outer dimension of the gas deflection member; and a plurality of purge gas openings that emit the flow of gas vertically to the edge of the substrate.

10. The apparatus of claim 9, wherein the purge gas openings emit the flow of gas horizontally to the edge of the substrate.

11. The apparatus of claim 9, wherein the purge gas openings emit the flow of gas adjacent to the edge of the substrate.

12. The apparatus of claim 9, wherein the gas passage is disposed at least partially in the substrate support member.

13. The apparatus of claim 9, wherein the purge gas openings comprise exit orifices having nozzles to accelerate the flow of the gas.

14. An apparatus for delivering a purge gas to an edge of a substrate, comprising:

a substrate support member;

a purge gas passage connecting a source of the purge gas to the edge of the substrate;

a purge gas guide member disposed at least partially in the purge gas passage; and one or more grooves formed in the purge gas guide member at an angle to a linear divergence from the center of the substrate support member.

15. The apparatus of claim 14, wherein the purge gas passage is disposed at least partially in the substrate support member.

16. The apparatus of claim 14, wherein the one or more grooves extend from a peripheral edge of the purge gas guide member at an angle between about 10 and 90 degrees to a linear divergence from the center of the purge gas guide member.

17. The apparatus of claim 14, further comprising a ring adapted and positioned to direct the flow of the purge gas from a peripheral edge of the purge gas guide member over the one or more grooves.

18. A method of preventing deposition on an edge of a substrate comprising:

flowing a purge gas to a process chamber;

passing the purge gas over a deflection surface of a purge gas guide member having one or more grooves; and directing the purge gas along the peripheral edge of the substrate at an angle to a linear divergence from the center of the purge gas guide member.

19. The method of claim 18, further comprising introducing the purge gas into the process chamber at a position removed from the edge of the substrate.

20. The method of claim 18, wherein the purge gas is directed at an angle between about 10 and 90 degrees to a linear divergence from the center of the substrate.

* * * * *

UNITED STATES PATENT AND TRADEMARK OFFICE
CERTIFICATE OF CORRECTION

PATENT NO.    : 6,248,176 B1  
DATED         : June 19, 2001  
INVENTOR(S)   : Yudovsky, J. et al.

It is certified that error appears in the above-identified patent and that said Letters Patent is hereby corrected as shown below:

Column 13,
Line 6, please change "1" to -- 7 --.

Signed and Sealed this

Twenty-sixth Day of November, 2002

*Attest:*

*Attesting Officer*

JAMES E. ROGAN
*Director of the United States Patent and Trademark Office*